United States Patent [19]

Dearnaley

[11] Patent Number: 4,629,631
[45] Date of Patent: Dec. 16, 1986

[54] SURFACE TREATMENT OF METALS
[75] Inventor: Geoffrey Dearnaley, Abingdon, England
[73] Assignee: United Kingdom Atomic Energy Authority, London, England
[21] Appl. No.: 773,816
[22] Filed: Sep. 9, 1985
[30] Foreign Application Priority Data Sep. 14, 1984 [GB] United Kingdom ............... 8423255

[51] Int. Cl.$^4$ ............................................. B05D 3/06
[52] U.S. Cl. ................................. 427/38; 204/192.31; 250/492.2
[58] Field of Search ............ 427/35, 36, 38, 39; 204/192 N; 250/492.21

[56] References Cited
U.S. PATENT DOCUMENTS

| 3,832,219 | 8/1974 | Nelson et al. ........................ 427/38 |
| 3,900,636 | 8/1975 | Curry et al. .......................... 427/38 |
| 4,105,443 | 8/1978 | Dearnaley et al. .................. 427/38 |
| 4,465,524 | 8/1984 | Dearnaley et al. ................ 148/31.5 |
| 4,486,247 | 12/1984 | Ecer et al. ........................... 427/38 |
| 4,532,149 | 3/1985 | McHargue ........................... 427/38 |

FOREIGN PATENT DOCUMENTS

| 326971 | 1/1976 | Austria . |
| 1954366 | 6/1971 | Fed. Rep. of Germany . |
| 1380583 | 1/1975 | United Kingdom . |
| 1423412 | 2/1976 | United Kingdom . |
| 2073254 | 10/1981 | United Kingdom . |

Primary Examiner—John H. Newsome
Attorney, Agent, or Firm—William R. Hinds

[57] ABSTRACT

A process for hardening the surface of a metal body in which the surface is first bombarded with ions capable of occupying interstitial sites in its crystal lattice, then a coating of a reactive metal is deposited on the surface, and finally the coating is bombarded with ions which will react with it to form a hard material such as a carbide or nitride. The bombardment is continued until the hard material has become embodied in the surface by means of radiation enhanced diffusion.

7 Claims, 3 Drawing Figures

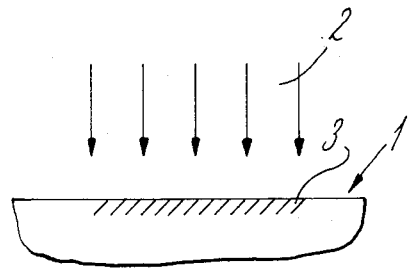
Fig_1 (a)
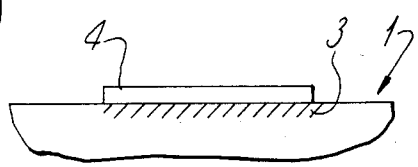
Fig_1 (b)
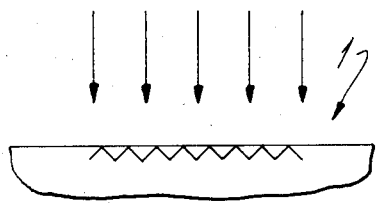
Fig_1 (c)

SURFACE TREATMENT OF METALS

The present invention relates to the surface treatment of materials, and more particularly to the increasing of the surface hardness of metals.

It is known that the implantation of ions of elements such as N, C or B which can occupy interstitial sites in the crystal lattices of alloys such as steel will increase their surface hardness and resistance to wear. It is known also that surface coatings of metals such as titanium or tantalum can be hardened by bombardment with ions of nitrogen, to convert the surface coating to hard titanium nitride, or tantalum nitride, respectively.

Although such a process is satisfactory when applied to a substrate such as a martensitic steel, which is in itself hard, the hard coatings can be damaged and removed relatively easily from softer substrate materials.

According to the present invention there is provided a method of modifying the properties of a surface of a metal body, comprising the operations of implanting into the said surface ions of a material capable of occupying interstitial sites in the crystal lattice of the body, so as to harden initially the said surface, deposition onto the hardened surface a layer of a reactive metal, and subjecting the deposited layer to bombardment with a reactive ion species capable of reacting with the said reactive metal to provide a hard, wear resisting compound, the energy of the reactive ion species initially being such as to cause radiation enhanced diffusion of the metal layer into the substrate and then reduced so as to implant the reaction ion species into the metallic layer to form the said hard, wear resisting compound.

Suitable ion species for the initial hardening stage of the process are $N^+$, $C^+$ or $B^+$. Suitable reactive metals are titanium, tantanlum, zirconium, or hafnium, and suitable reactive ion species are $N^+$, $B^+$ and $CO^+$, or a mixture of two or more of the ion species. The initial ion bombardment preferably is carried out with ion energies in the range 100–150 KeV. The reactive metal can be deposited by any of the conventional vacuum deposition techniques, examples being electron beam evaportion, thermal evaporation, or sputtering. The final stage is commenced with ion beam energies similar to those used in the first stage, but then reduced to within the range 10–30 KeV.

The invention will now be described, by way of example, with reference to the accompanying drawings (FIGS. 1(a), 1(b), and 1(c)) which illustrate the operations involved in a process embodying the invention.

Referring to the drawings, in FIG. 1(a) there is shown a part of a substrate body 1 made of a conventional engineering steel, which is being subjected to bombardment with a beam 2 of $N^+$ ions at an energy of 150 KeV. This bombardment is continued until an ion dose of some $10^1$ ions/sq cm has been implanted into a surface region 3 of the body 1, which is to be hardened to enhance its wear resistance. The surface region 3 of the body 1 is then coated with a layer 4 of a reactive metal such as titanium by means of an electron beam evaporation process until a deposit some 200 nm thick has been built up, as illustrated in FIG. 1(b) of the drawing. Bombardment with ions is then re-commenced, as shown in FIG. 1(c) of the drawings, initially with the same energy as before, but with a mixture of $N^+$ and $CO^+$ ions. Finally the ion energy is reduced to about 30 KeV until the deposited titanium has reacted with the $N^+$ and $CO^+$ ions to form mixed oxy-carbo-nitrides of titanium.

In a modified form of the process, which is not illustrated, ions of a species which are oversized in relation to the crystal lattice, such as yttrium are implanted together with the interstitial species during the first stage of the process. These ions associate with the interstitial ions to form substitutional-interstitial pairs or dipoles which act as powerful obstacles to the movement of dislocations within the crystal lattice.

I claim:

1. A method of modifying the properties of a surface of a metal body, wherein there is included the operations of implanting into the said surface ions of a material capable of occupying interstitial sites in the crystal lattice of the body, so as to harden initially the said surface, depositing onto the hardened surface a layer of a reactive metal, and subjecting the deposited layer to bombardment with a reactive ion species capable of reacting with the said reactive metal to provide a hard, wear resisting compound, the energy of the reactive ions species initially being such as to cause radiation enhanced diffusion of the metal layer into the substrate and then reduced so as to implant the reactive ion species into the metallic layer to form the said hard, wear resisting compound.

2. A method according to claim 1 wherein the ions which are capable of occupying interstitial sites in the crystal lattice are selected from the group comprising $N^+$, $C^+$ and $B^+$ ions.

3. A method according to claim 1 wherein the reactive metals are selected from the group comprising titanium, tantalum, zirconium, and hafnium.

4. A method according to claim 1, wherein the reactive ions are selected from the group comprising $N^+$, $B^+$ and $CO^+$.

5. A method according to claim 1 wherein the initial ion bombardment is carried out with ion energies in the range 100–150 KeV, and the final operation is commenced with ion energies in the range 100–150 KeV, and finished with ion energies in the range 10–30 KeV.

6. A method according to claim 1 wherein there is included the operation of implanting ions of a material which are oversized in relation to the crystal lattice of the material of the said body simultaneously with the ions which are capable of occupying interstitial sites in the crystal lattice of the body.

7. A method according to claim 2 wherein the reactive metals are selected from the group comprising titanium, tantalum, zirconium, and hafnium.

* * * * *